(12) United States Patent
Meacham et al.

(10) Patent No.: US 8,497,789 B2
(45) Date of Patent: Jul. 30, 2013

(54) MODIFIED DYNAMIC ELEMENT MATCHING FOR REDUCED LATENCY IN A PIPELINE ANALOG TO DIGITAL CONVERTER

(75) Inventors: Daniel Meacham, Del Mar, CA (US); Andrea Panigada, San Diego, CA (US); Jorge Grilo, San Diego, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/489,962

(22) Filed: Jun. 6, 2012

(65) Prior Publication Data

US 2013/0002459 A1    Jan. 3, 2013

Related U.S. Application Data

(60) Provisional application No. 61/495,939, filed on Jun. 10, 2011.

(51) Int. Cl.
*H03M 1/06* (2006.01)

(52) U.S. Cl.
USPC ........... 341/118; 341/120; 341/155; 341/161; 341/162

(58) Field of Classification Search
USPC .......................... 341/118, 120, 155, 161, 162
See application file for complete search history.

(56) References Cited

U.S. PATENT DOCUMENTS

| | | | | |
|---|---|---|---|---|
| 6,396,429 B2 * | 5/2002 | Singer et al. | | 341/155 |
| 6,456,223 B1 * | 9/2002 | Yu et al. | | 341/161 |
| 6,734,818 B2 | 5/2004 | Galton | | 341/161 |
| 6,882,292 B1 * | 4/2005 | Bardsley et al. | | 341/121 |
| 6,970,125 B2 * | 11/2005 | Cesura et al. | | 341/161 |
| 7,221,299 B2 * | 5/2007 | Bjornsen | | 341/131 |
| 7,602,323 B2 | 10/2009 | Galton et al. | | 341/118 |
| 8,164,496 B2 * | 4/2012 | Velazquez | | 341/118 |
| 2004/0222912 A1 | 11/2004 | McMahill | | 341/161 |
| 2004/0227650 A1 * | 11/2004 | Cesura et al. | | 341/118 |
| 2006/0022854 A1 * | 2/2006 | Bjornsen | | 341/120 |
| 2007/0222656 A1 * | 9/2007 | Melanson | | 341/155 |
| 2010/0225513 A1 | 9/2010 | Lin | | 341/120 |

OTHER PUBLICATIONS

Panigada, A., et al,, "A 130 mW 100 MS/a Pipelined ADC with 69 dB SNDR Enabled by Digital Harmonic Distortion Correction", IEEE Journal on Solid State Circuits, vol. 44, No. 12; pp. 3314-3328.

Li, Jipeng, et al., "Background Calibration Techniques for Multistage Pipelined ADCs with Digital Redundancy", IEEE Transactions on Circuits and Systems II: Analog and Digital Signal Processing, Institute of Electrical and Electronics Engineers, vol, 50, No. 9; pp. 8 pages.

International PCT Search Report and Written Opinion, PCT/US2012/041274, 18 pages.

* cited by examiner

*Primary Examiner* — Linh Nguyen
(74) *Attorney, Agent, or Firm* — King & Spalding L.L.P.

(57) ABSTRACT

A pipeline ADC is provided in which a DEM function and summation of sequences occur within a flash ADC. According to various aspects of the present disclosure, embedding the processing functions needed for DAC and amplifier error correction with the circuitry of a coarse ADC and rearranging the digital calibration blocks HDC and DNC ensures accurate estimation of the errors.

14 Claims, 6 Drawing Sheets

US 8,497,789 B2

MODIFIED DYNAMIC ELEMENT MATCHING FOR REDUCED LATENCY IN A PIPELINE ANALOG TO DIGITAL CONVERTER

CROSS-REFERENCE TO RELATED APPLICATIONS

This invention claims priority from U.S. Provisional Patent Application Ser. No. 61/495,939 filed June 10, 2011, which is hereby incorporated by reference in its entirety as if fully set forth herein.

BACKGROUND OF THE INVENTION

1. Field of the Invention

This invention relates generally to analog-to-digital converters. More specifically, this application relates to reduced latency in an analog-to-digital converter. The disclosure is associated with high-speed pipeline analog-to-digital converters (ADC's), and may also be extended to other applications and ADC architectures. For example, the techniques described herein may be applied to algorithmic ADCs, also known as cyclic ADCs, to delta-sigma ADCs, to SAR ADCs, etc., and generally to any ADC that may require one or more digital-to-analog converters.

2. Description of the Related Art

Pipeline analog-to-digital converters (ADCs) are subranging data converters in which a signal is quantized coarsely in several steps and the results of the different steps are then combined to achieve a high level of quantization accuracy. Pipeline ADCs are popular because they may operate at very high speeds (hundreds of MHz, depending on the technology employed) while achieving relatively large dynamic range.

Referring to FIG. 1A, a typical pipeline ADC 10 includes a plurality of stages 12, 14, . . . , L. In the first stage 12, the input Vin is converted using a flash ADC (not shown) and is combined with results from the subsequent stages 14, 16, . . . , L to form an output. As will be discussed in greater detail below, the error in each stage is determined by converting the output of that stage using a digital-to-analog converter. The difference between the input to the stage and the error is the "residue." The residue for each stage is amplified and fed to the next stage and converted in the same fashion in the next stage. The output of the last stage L is provided to a backend ADC 16 which resolves the last bits. All outputs may be provided for time alignment and digital error correction 20.

As shown in FIG. 1B, a typical stage 100 in a pipeline ADC includes an input signal sampling network 108, an N-bit coarse ADC 102 with its own sampling network, an N-bit digital-to-analog converter 104 (DAC) and an amplifier 106. The sampling network 108 and flash ADC 102 sample the input signal 101 at the same time. The DAC 104 converts the quantized signal back into analog form and this signal is subtracted 110 from the main input signal 101. The residue 105 resulting from this operation is amplified using amplifier 106 in order to occupy, typically and in the absence of errors, a portion of the range of the following stage, for example, half. Ideally, the residue then consists only of quantization noise.

Three factors may limit the performance and speed of operation of a pipeline ADC: errors occurring within the DAC 104 known as element mismatches; errors occurring within the amplifier 106 due to gain and nonlinearity; and excessive delay through the flash ADC 102 and DAC 104 signal paths. All three result in degradation of the ADC linearity and signal-to-noise ratio (SNR).

FIG. 2 illustrates pipeline stage using a prior technique for addressing DAC 104 errors. The stage 200 includes an input signal sampling network 208, an N-bit coarse ADC 202 with its own sampling network, an M-bit digital-to-analog converter 104 (DAC) (where M>N) and an amplifier 206. Processing elements 232, 234 are added between the coarse ADC 202 and the DAC 204 and hence increase the delay in that path. This delay is critical in high speed operation, namely operation at rates of 250 MSPS and higher. An application of the technique of FIG. 2 has been proposed by others to address the problem of element mismatches in flash ADCs, by permuting reference thresholds presented to the comparators to improve the linearity of an ADC.

DAC and amplifier errors as described above are sometimes estimated and canceled or corrected using Dynamic Element Matching (DEM) and Harmonic Distortion Correction (HDC) techniques.

DEM takes thermometer-coded outputs of a coarse ADC and permutes them before they are provided to the connected DAC elements. The permutation matrix is such that every ADC output can reach every DAC input. The method of permutation sometimes randomizes the DAC errors, thereby creating a white spectrum, or shapes the errors such that the energy of an error signal occupies a region of frequencies outside the band of interest. In FIG. 2, the pipeline stage includes a DEM block 232 between the coarse ADC 202 and the DAC 204 and the proper placement relative to the stage digital outputs. The DEM block 232 can be implemented efficiently through the use of transmission gates. However, it introduces a finite delay which is non-negligible at high clock rates.

In a pipeline ADC, DEM is used with additional digital processing that estimates the DAC error signal and effectively removes it from the output. If this were not done, the DAC noise would decrease the SNR. This estimation and removal of the DAC errors is referred to in the literature as DAC noise cancellation (DNC).

Continuing with FIG. 2, a signal $\Sigma t$ is added 234 to the output of the coarse ADC 202. This signal consists of the sum of several random, independent sequences that are used in the estimation of the amplifier 206 errors, for example, gain and nonlinearity. The number of sequences depends on the order of nonlinearity that needs to be estimated: one sequence for linear gain error, three sequences for harmonic error, and so on.

Also shown in FIG. 2 is backend ADC 212, whose output is provided to amplifier 220 and HDC module 222, whose output is summed 230 with the output of DNC module 226.

In an HDC technique, the output of the residue amplifier 212 contains terms in the quantization noise of the coarse ADC 202, the random sequences and their interaction through the amplifier nonlinear characteristic. If the highest significant order of nonlinearity in the amplifier is 3, the output of the residue amplifier 212 contains one term proportional to $a_3 (\Sigma t)^3$ where $a_3$ is the third order nonlinearity coefficient and $\Sigma t = t1 + t2 + t'$, three random sequences that can each take on values $+A$ or $-A$ where A is a constant quantity. Therefore, $\Sigma t$ is a four level signal that can take on values $-3A, -A, +A, +3A$. Since the product of random independent sequences is also a random and independent sequence, multiplying the (digitized) residue amplifier output by $(t1, t2, t3)$ randomizes all terms except the one in $a_3 (\Sigma t)^3$ which can be extracted with a lowpass filter.

A consequence of adding the random sequences to the output of the coarse ADC 202 is that the word length increases and the DAC 204 size and complexity increase accordingly. That is why the DAC 204 resolution M is greater than the coarse flash ADC 202 resolution N. In a typical implementation, M=N+3.

FIG. 3 is an example of a prior art implementation of a coarse ADC with N=2 bits resolution. This implementation is often called a flash ADC. Four comparators 302.n compare the input voltage on line 304 to four threshold voltages (THR1, THR2, THR3, THR4) respectively. In some implementations, the threshold voltages may be associated with a resistor ladder 306. Other voltage divider techniques may be used as well. If the input voltage is greater than THR1, then comparator 302.1 outputs a logical 1, otherwise it outputs a logical zero. Similarly, comparator 302.2 compares the input voltage with THR2 and so on. The output of the coarse ADC 206 is a digital word formed from the outputs of all the comparators. This word is often denominated a "thermometer code." The number of logical ones contained in the thermometer code is the digital representation of the analog input voltage on line 304.

One example circuit embodying the comparator function is shown in FIG. 4. Only the circuitry to compare the input against THR1 (corresponding to 302.1) is shown for clarity of explanation. The circuit 302.1 includes eight switches 408, 410, 412, 414, 416, 418, 420, 422, two capacitors 402, 404, and a comparator 406. The switches are driven by periodic clocks denoted phase 1, phase 2. When phase 1 is true, phase 2 is false and vice versa. When phase 1 is true, the upper capacitor 402 is charged to the voltage THR1, whereas the lower capacitor 404 is charged to the input voltage. When phase 2 is true, the capacitors are connected to comparator 406. Many alternative circuit realizations of the comparator 302.1 exist in the relevant art, which accomplish the following function:

Output 1=1 if (input−THR1)>0, 0 otherwise

That is, the signal output 406 is a logical 1 if the input voltage is greater than the threshold voltage THR1, a logical zero otherwise.

SUMMARY OF THE INVENTION

These and other drawbacks in the prior art are overcome in large part by a system and method according to embodiments of the present invention.

According to various aspects of the present disclosure, a pipeline ADC is provided in which these problems are overcome in that a DEM function and summation of sequences occur within a flash ADC. According to various aspects of the present disclosure, embedding the processing functions needed for DAC and amplifier error correction with the circuitry of a coarse ADC and rearranging the digital calibration blocks HDC and DNC ensures accurate estimation of the errors.

A system for error correction of a pipeline analog to digital converter ("ADC"), wherein the pipeline ADC converts a voltage signal to a digital version of the voltage signal, includes a coarse ADC wherein an input terminal of the coarse ADC receives the voltage signal and a reference signal and provides a digital version of the voltage signal value relative to the reference signal to a digital to analog converter ("DAC") input terminal; a first adder for combining the voltage signal and an output signal from the DAC, wherein the first adder result is provided to a residue amplifier; a backend ADC, wherein the backend ADC provides a digital version of an output voltage signal received from the residue amplifier; a second adder for summing digital values received from the coarse ADC, a digital to analog converter noise cancellation ("DNC") circuit, and a harmonic distortion correction ("HDC") circuit, thereby providing a pipelined ADC output; a circuit for estimating distortion parameters from the residue amplifier and digital to analog converter comprising: the HDC, wherein the HDC, responsive to the pipelined ADC output, corrects distortion components due to the residue amplifier present in the digital signal from the backend ADC; and the DNC circuit, wherein the DNC circuit, responsive to the pipelined ADC output, corrects the distortion components due to the DAC present in the digital signal from the backend ADC; and a circuit for modifying the reference signal to the coarse analog to digital converter.

In some embodiments, the circuit for modifying the reference signal includes a voltage divider for dividing a reference source voltage; a dynamic element matching ("DEM") circuit receiving the divided voltage signals, each divided voltage signal connected to a corresponding switch, wherein each switch is controlled by the DEM circuit and further wherein all output terminals from the switches are connected in parallel to a first side of a high side capacitor; and a sequences adder block receiving HDC signals, each HDC signal connected to a corresponding switch, wherein each switch is controlled by the HDC circuit and further wherein all output terminals from the switches are connected in parallel to a second side of the high side capacitor.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DETAILED DESCRIPTION OF EMBODIMENTS OF THE INVENTION

A pipeline ADC according to embodiments as claimed embeds the processing functions needed for the DAC and amplifier error correction with the circuitry of a coarse ADC and also provides a new configuration for digital calibration blocks HDC and DNC, thus ensuring accurate estimation of the errors. The calibration of the signal, that is the correction portion of the DNC and HDC techniques, may be applied as disclosed in Galton, U.S. Pat. No. 6,734,818 and Galton et al., in U.S. Pat. No. 7,602,323, which are incorporated by reference as if fully set forth herein. Other DNC and HDC techniques may be used. The estimation of the signal in accordance with the present disclosure.

Figure 5:
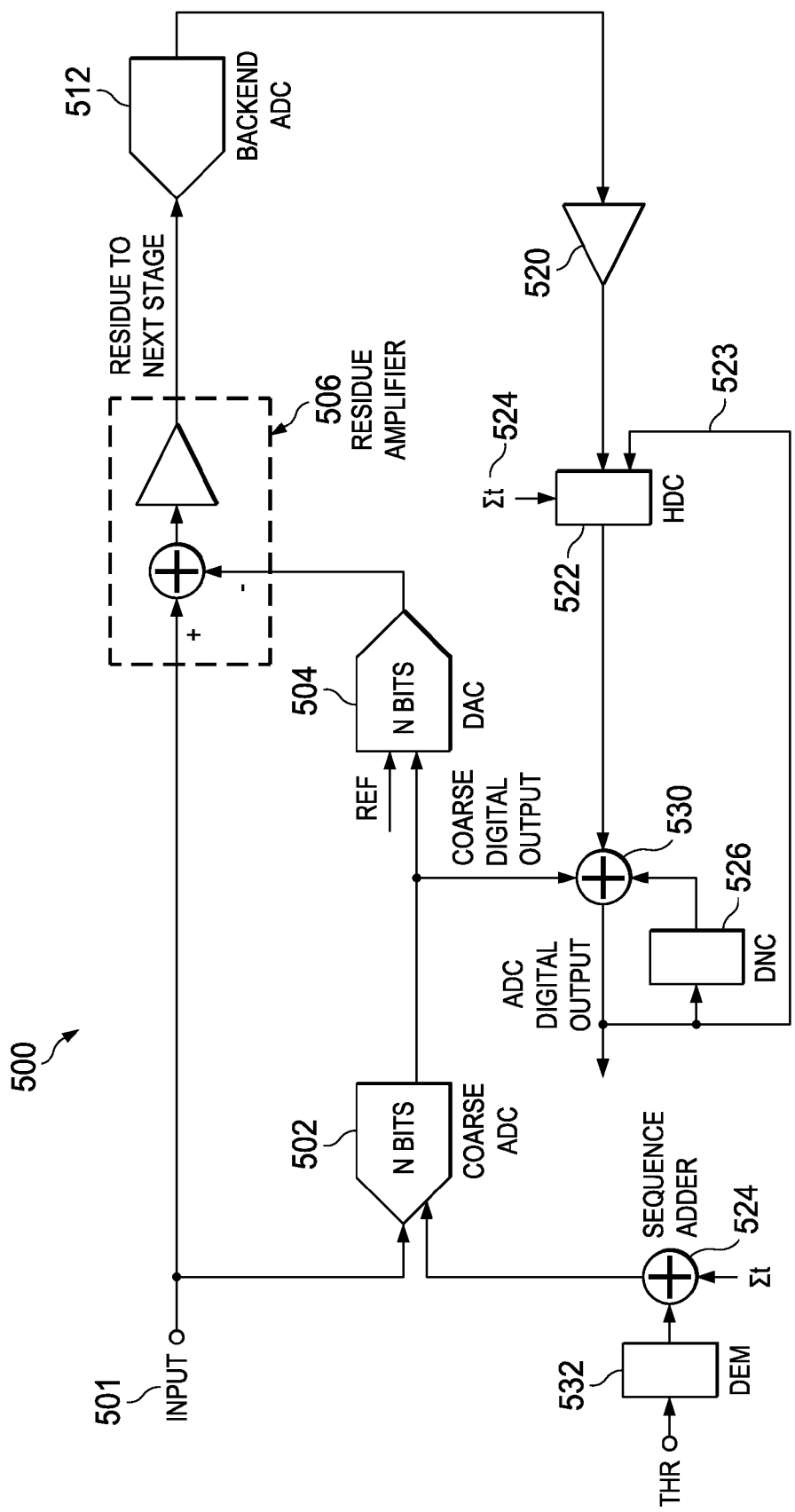
FIG. 5 illustrates an example pipeline ADC circuit in accordance with principles of the disclosure.

More particularly, FIG. 5 illustrates a pipeline stage in accordance with embodiments as claimed. The stage 500 includes an N-bit coarse ADC 502, an N-bit digital-to-analog converter 504 (DAC) and an amplifier 506. An input 501 is provided to the coarse ADC 502 and the residue amplifier 506.

Residue of the second-to-last stage may be provided to the backend ADC 512, which is amplified 520 and provided to HDC 522. A DEM block 532 and sequences adder 524 are provided at the front end of the coarse ADC 502. This configuration may minimize the propagation time of the critical signal path from the coarse ADC 502 through the DAC 504 to the residue amplifier 506.

In the embodiment illustrated, the digital calibration block HDC 522 may receive the sequences $\Sigma t$, as well as a feedback of the corrected digital output 523. In particular, the HDC 522 may provide its output to be summed 530 with the output of DNC 526.

Thus, the signal used to estimate the DAC error and the residue amplifier gain error is the ADC digital output 523. Therefore, over time, the estimator will extract and estimate of the residual error after the calibration has been applied. Such estimate may be added to the previous estimates, that is, integrated over time, to improve the accuracy of the calibration. The estimation will converge to the right values once the estimate of the residual error is zero.

Figure 6:
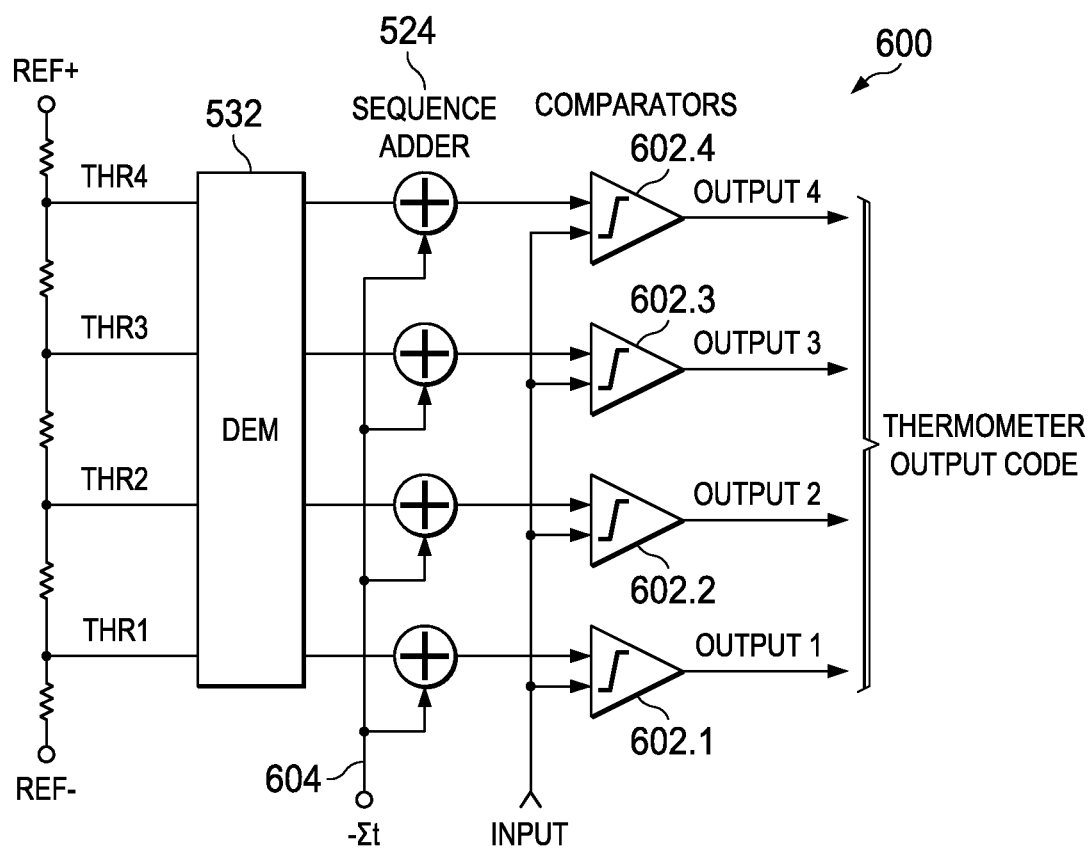
FIG. 6 illustrates an example of an ADC front end in accordance with of the disclosure.

FIG. 6 shows an example 600 of an aspect of the present disclosure of a coarse ADC with DEM 532 and sequences adder 524. The threshold voltages THR1, THR2, THR3 and THR4 can be permuted such that each threshold may be connected to any one of the comparators 602.*n*. The signal $\Sigma t$ (random sequences with the properties described above) on line 604 are subtracted from each threshold voltage. Each comparator 602.*n* will compare its input to the difference between one of the thresholds and the signal $\Sigma t$ on line 604.

Figure 7:
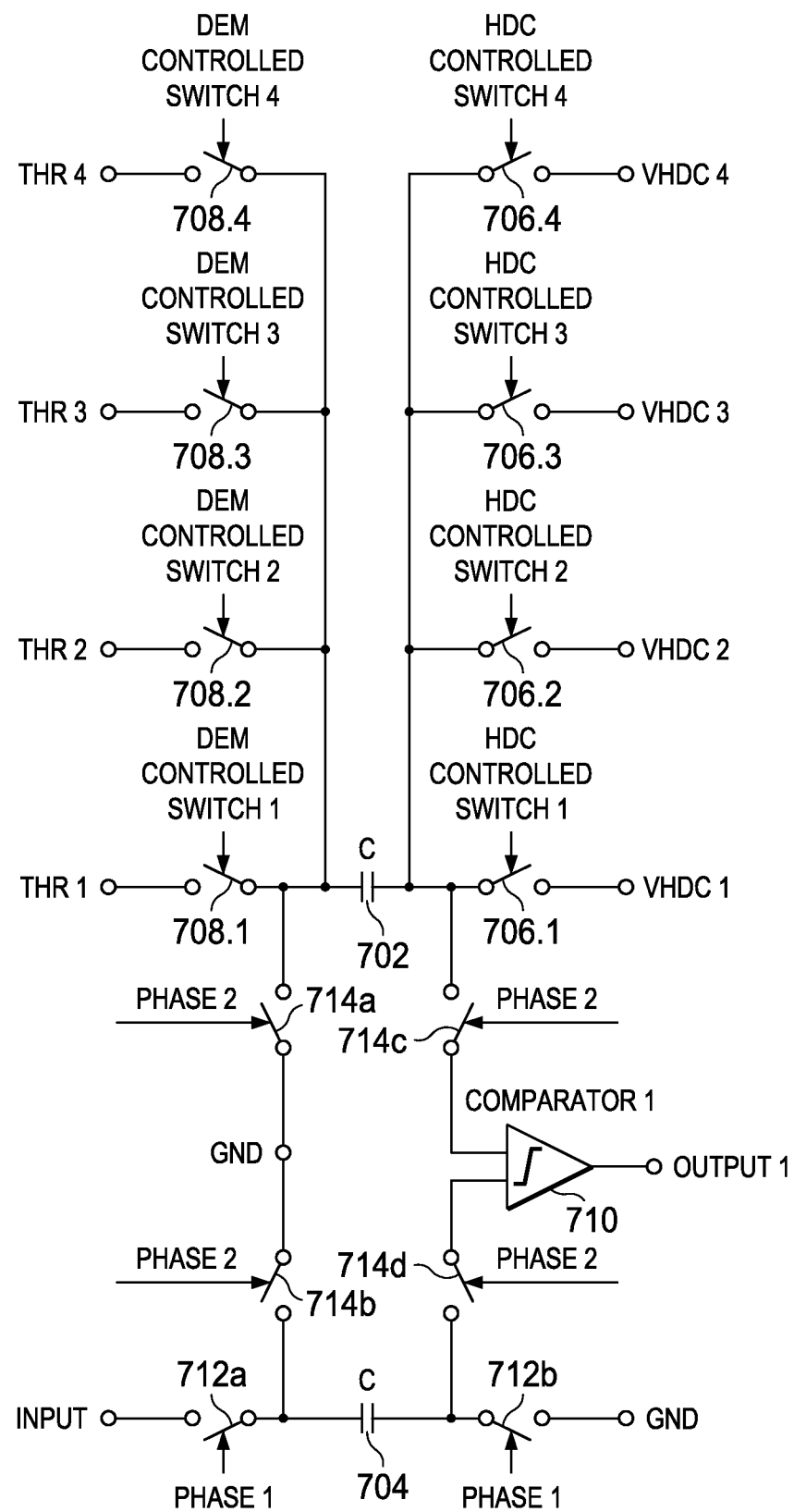
FIG. 7 illustrates an example of a comparator in accordance with principles of the disclosure.

FIG. 7 shows an example circuit that realizes the function just described. S shown, the circuit includes DEM controlled switches 708.1, 708.2, 708.3, and 708.4; HDC controlled switches 706.1, 706.2, 706.3, and 706.4, capacitors 702, 704, comparator 710, phase 1 switches 712*a*, 712*b*; and phase 2 switches 714*a*, 714*b*, 714*c*, 714*d*.

Figure 1A:
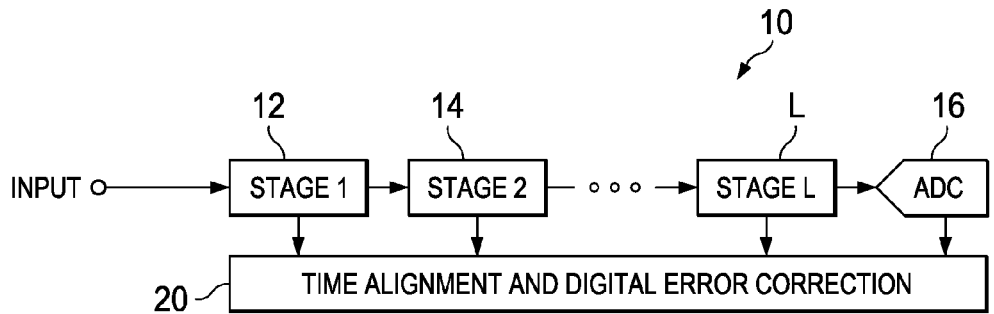
FIG. 1A illustrates an example of a prior art pipeline ADC.
Figure 1B:
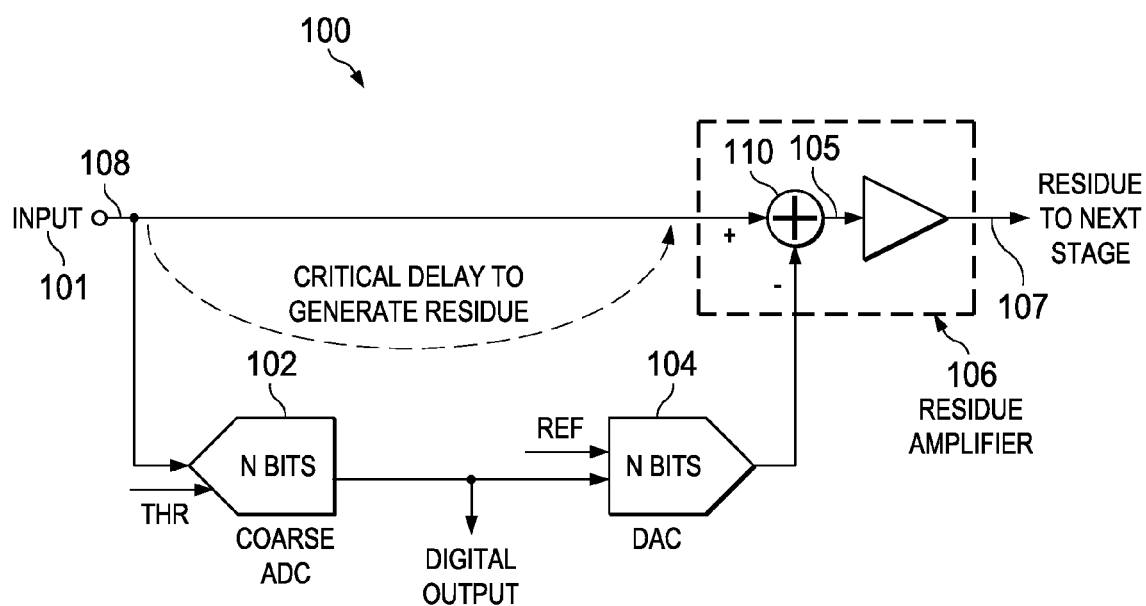
FIG. 1B illustrates an example of a prior art pipeline ADC stage.
Figure 2:
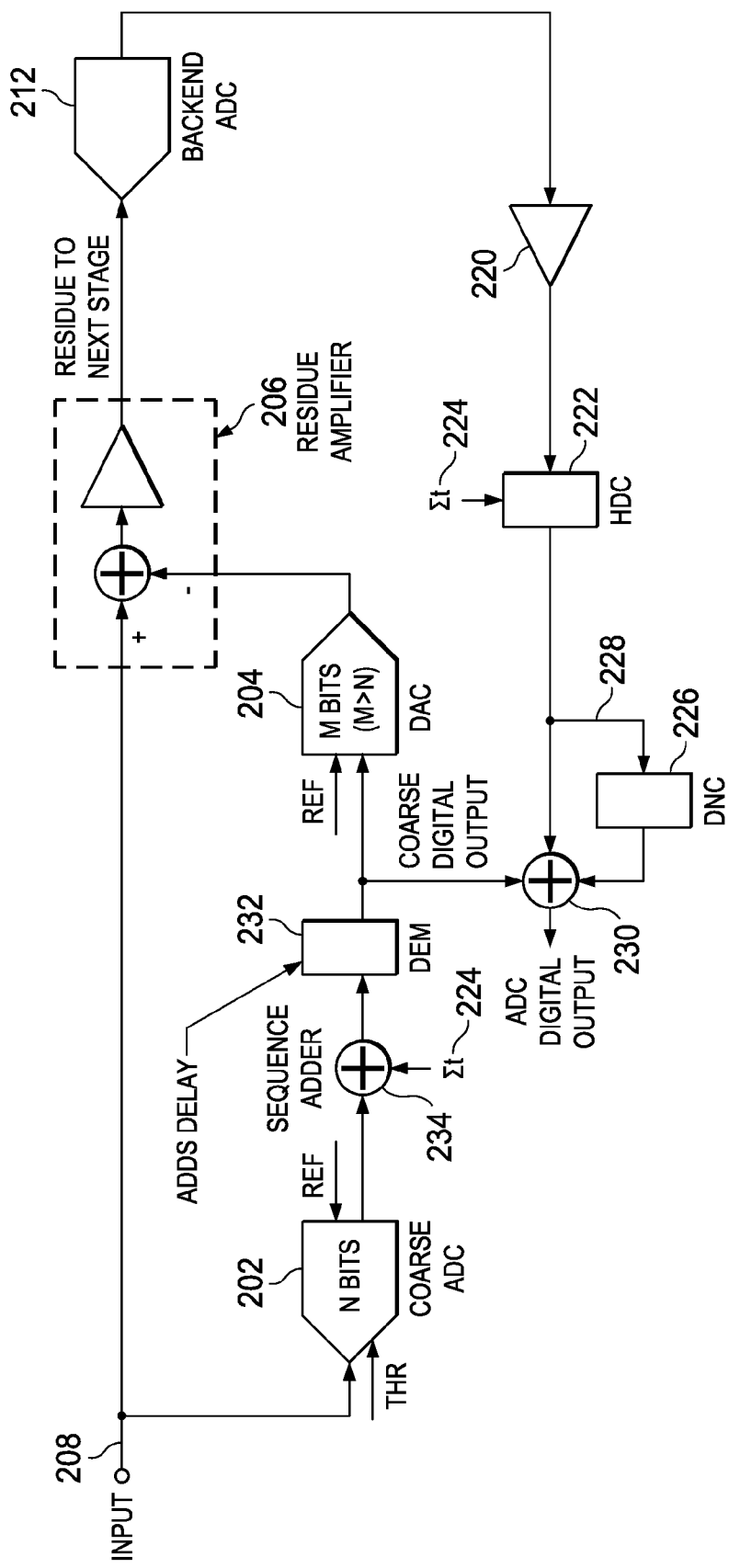
FIG. 2 illustrates another prior art pipeline ADC stage.
Figure 3:
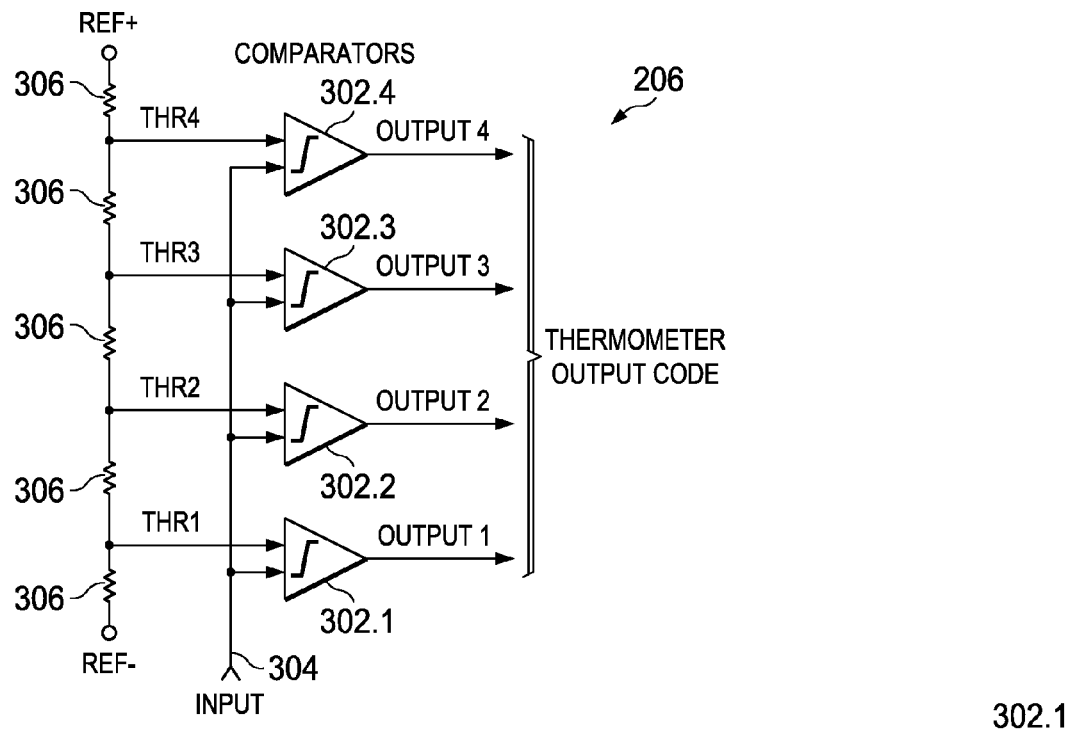
FIG. 3 illustrates an example of a prior art flash ADC architecture.
Figure 4:
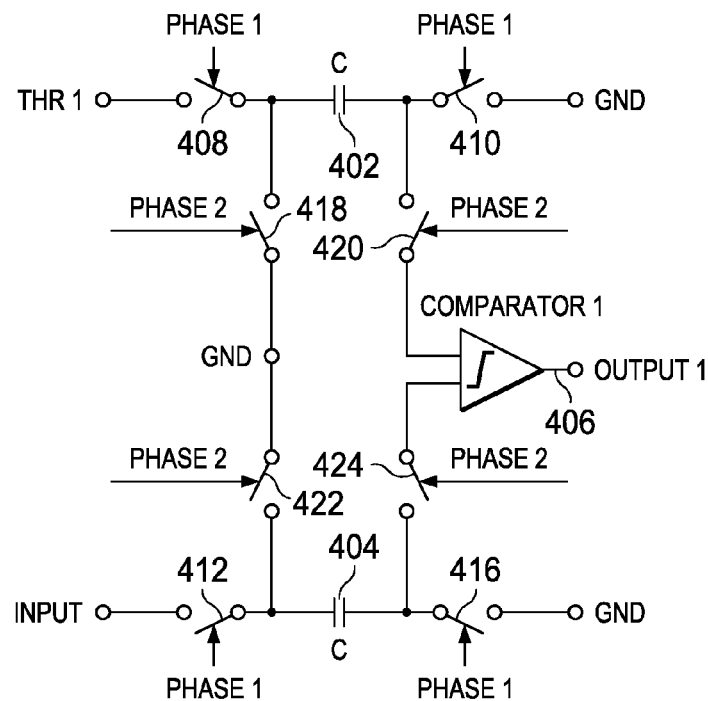
FIG. 4 illustrates an example of a prior art comparator from a coarse ADC.

During the time when phase 1 is TRUE, only one of the thresholds THRx (where x is 1, 2, 3 or 4) and only one of the voltages VHDCy (where y is 1, 2, 3 or 4, such that VHDC1=−3A, VHDC2=−A, VHDC3=+A and VHDC4=+3A) are connected to the upper capacitor 702. A DEM and HDC calibration operation will dictate which of the switches is ON at each clock phase cycle. The way DEM controls such switches has been described in detail in the disclosures by Galton in U.S. Pat. No. 6,734,818 and the way HDC generates the signal $\Sigma t$ has been described in detail in the disclosure by Galton et al in U.S. Pat. No. 7,602,323. The lower capacitor 704 operates as the capacitor 404 in the example of FIG. 4.

The addition of $\Sigma t$ in element 604 (FIG. 6) is implemented through the HDC-controlled switches 706.*n* that connect the upper capacitor 702 to VHDCy. The output of each comparator i (where i is 1, 2, 3 or 4) can be described by the equation:

Output i=1 if (input−THRx+VHDCy)>0, 0 otherwise.

Every implementation of a coarse ADC heretofore has been affected by errors due to circuit imperfections, fabrication mismatches, and the like. Such imperfections ultimately result in threshold errors. Although to some extent a pipeline ADC architecture can tolerate threshold errors without degrading performance, an embodiment per the present disclosure concept such errors are modulated by the DEM, and their presence may bias the estimate of the DAC errors and residue amplifier errors.

While specific implementations and hardware/software configurations for the mobile computing device have been illustrated, it should be noted that other implementations and hardware configurations are possible and that no specific implementation or hardware/software configuration is needed. Thus, not all of the components illustrated may be needed for the mobile computing device implementing the methods disclosed herein.

As used herein, whether in the above description or the following claims, the terms "comprising," "including," "carrying," "having," "containing," "involving," and the like are to be understood to be open-ended, that is, to mean including but not limited to. Only the transitional phrases "consisting of" and "consisting essentially of," respectively, shall be considered exclusionary transitional phrases, as set forth, with respect to claims, in the United States Patent Office Manual of Patent Examining Procedures.

Any use of ordinal terms such as "first," "second," "third," etc., in the claims to modify a claim element does not by itself connote any priority, precedence, or order of one claim element over another, or the temporal order in which acts of a method are performed. Rather, unless specifically stated otherwise, such ordinal terms are used merely as labels to distinguish one claim element having a certain name from another element having a same name (but for use of the ordinal term).

The above described embodiments are intended to illustrate the principles of the invention, but not to limit the scope of the invention. Various other embodiments and modifications to these preferred embodiments may be made by those skilled in the art without departing from the scope of the present invention.

What is claimed is:

1. A system for error correction of a pipeline analog to digital converter ("ADC"), wherein the pipeline ADC converts a voltage signal to a digital version of the voltage signal, comprising:

a coarse ADC wherein an input terminal of the coarse ADC receives the voltage signal and a reference signal and provides a digital version of the voltage signal value relative to the reference signal to a digital to analog converter ("DAC") input terminal;

a first adder for combining the voltage signal and an output signal from the DAC, wherein the first adder result is provided to a residue amplifier;

a backend ADC, wherein the backend ADC provides a digital version of an output voltage signal received from the residue amplifier;

a second adder for summing digital values received from the coarse ADC, a digital to analog converter noise cancellation ("DNC") circuit, and a harmonic distortion correction ("HDC") circuit, thereby providing a pipelined ADC output;

a circuit for estimating distortion parameters from the residue amplifier and digital to analog converter comprising:

the HDC, wherein the HDC, responsive to the pipelined ADC output, corrects distortion components due to the residue amplifier present in the digital signal from the backend ADC; and the DNC circuit, wherein the DNC circuit, responsive to the pipelined ADC output, corrects the distortion components due to the DAC present in the digital signal from the backend ADC; and a circuit for modifying the reference signal to the coarse analog to digital converter.

2. The system of claim 1, wherein the circuit for modifying the reference signal comprises:

a voltage divider for dividing a reference source voltage;

a dynamic element matching ("DEM") circuit receiving the divided voltage signals, each divided voltage signal connected to a corresponding switch, wherein each switch is controlled by the DEM circuit and further wherein all output terminals from the switches are connected in parallel to a first side of a high side capacitor; and a sequences adder block receiving HDC signals, each HDC signal connected to a corresponding switch, wherein each switch is controlled by the HDC circuit and further wherein all output terminals from the switches are connected in parallel to a second side of the high side capacitor.

3. The system of claim 1, wherein the ADC and the DAC are n bit devices.

4. A pipeline analog-to-digital (ADC) converter, comprising:

a back end analog-to-digital (ADC) converter configured to receive a residue output; and at least one stage circuit, the stage circuit comprising;

a coarse ADC coupled to receive an input signal and provide a coarse digital output to a digital-to-analog (DAC) converter;

a residue amplifier configured to receive the input signal and an output of the DAC and provide a residue output to the backend ADC;

a circuit for estimating distortion parameters from the residue amplifier and DAC, comprising:

an amplifier configured to receive an output of the backend DAC;

a harmonic distortion correction circuit (HDC) coupled to the amplifier and configured to correct distortion components due to the residue amplifier present in the digital signal from the backend ADC, the HDC circuit providing an output to an adder, the adder receiving the coarse digital output; and a DAC noise cancellation circuit (DNC) configured to provide an output to the adder, wherein the DNC circuit is configured to correct the distortion components due to the DAC present in the digital signal from the backend ADC;

wherein the output of the adder is an ADC digital output and wherein the ADC digital output forms an input to the HDC and the DNC; and a circuit for modifying a reference signal to the coarse ADC.

5. The pipeline analog-to-digital (ADC) converter of claim 4, wherein the circuit for modifying the reference signal comprises:

a voltage divider for dividing a reference source voltage into a plurality of divided voltage signals;

a dynamic element matching ("DEM") circuit receiving the divided voltage signals, each divided voltage signal connected to a corresponding switch, wherein each switch is controlled by the DEM circuit and further wherein all output terminals from the switches are connected in parallel to a first side of a high side capacitor; and a sequences adder block receiving HDC signals, each HDC signal connected to a corresponding switch, wherein each switch is controlled by the HDC circuit and further wherein all output terminals from the switches are connected in parallel to a second side of the high side capacitor.

6. The pipeline analog-to-digital (ADC) converter of claim 5, wherein the ADC and the DAC are n bit devices.

7. A pipeline analog-to-digital converter (ADC) for converting an input signal, comprising:

a coarse analog-to-digital converter (ADC) configured to provide a coarse digital output to a digital-to-analog converter (DAC);

a residue amplifier configured to receive an output of the DAC and the input signal and generate a residue for a next pipeline stage;

a circuit for estimating distortion parameters from a residue amplifier and the DAC, the circuit including:

a harmonic distortion correction (HDC) circuit configured to provide an output to an adder, the adder receiving as an input an output of the coarse ADC; and a feedback loop including a DAC noise cancellation (DNC) circuit configured to provide an output to the adder;

wherein an output of the adder is an ADC digital output and is an input to the DNC circuit; and a circuit for modifying a reference signal to the coarse ADC.

8. The pipeline analog-to-digital converter (ADC) of claim 7, wherein the HDC circuit is configured to receive one or more random sequences for estimating nonlinearities.

9. The pipeline analog-to-digital converter (ADC) of claim 8, wherein the HDC circuit is configured to provide an output to the circuit for modifying the reference signal to the coarse ADC.

10. The pipeline analog-to-digital converter (ADC) of claim 8, wherein the circuit for modifying the reference signal comprises:

a voltage divider for dividing a reference source voltage;

a dynamic element matching ("DEM") circuit receiving the divided voltage signals, each divided voltage signal connected to a corresponding switch, wherein each switch is controlled by the DEM circuit and further wherein all output terminals from the switches are connected in parallel to a first side of a high side capacitor; and a sequences adder block receiving HDC signals, each HDC signal connected to a corresponding switch, wherein each switch is controlled by the HDC circuit and further wherein all output terminals from the switches are connected in parallel to a second side of the high side capacitor.

11. A method for operating a pipeline analog-to-digital converter (ADC) for converting an input signal, comprising:

providing a coarse digital output from a coarse analog-to-digital converter (ADC) to a digital-to-analog converter (DAC)

receiving an output of the DAC and the input signal at a residue amplifier and generating a residue for a next pipeline stage;

estimating distortion parameters from the residue amplifier output and the DAC output, the estimating including:

performing a harmonic distortion correction as an output to an adder, the adder receiving as another input an output of the coarse ADC; and implementing a feedback loop including a DAC noise cancellation (DNC) providing an output to the adder;

wherein an output of the adder is an ADC digital output and is an input to the DNC circuit.

12. A method for operating a pipeline analog-to-digital converter (ADC) for converting an input signal in accordance with claim 11, further including modifying a reference signal to the coarse ADC.

13. A method for operating a pipeline analog-to-digital converter (ADC) for converting an input signal in accordance with claim 11, wherein the HDC circuit receives one or more random sequences for estimating nonlinearities.

14. A method for operating a pipeline analog-to-digital converter (ADC) for converting an input signal in accordance with claim 13, wherein the HDC circuit provides an output to the circuit for modifying the reference signal to the coarse ADC.

* * * * *